(12) United States Patent
Aggarwal et al.

(10) Patent No.: US 8,067,061 B2
(45) Date of Patent: Nov. 29, 2011

(54) REACTION APPARATUS HAVING MULTIPLE ADJUSTABLE EXHAUST PORTS

(75) Inventors: Ravinder Aggarwal, Gilbert, AZ (US); Jeroen Stoutjesdijk, Bussum (NL)

(73) Assignee: ASM America, Inc., Phoenix, AZ (US)

( * ) Notice: Subject to any disclaimer, the term of this patent is extended or adjusted under 35 U.S.C. 154(b) by 959 days.

(21) Appl. No.: 11/924,418

(22) Filed: Oct. 25, 2007

(65) Prior Publication Data

US 2009/0110826 A1    Apr. 30, 2009

(51) Int. Cl.
*C23C 16/00* (2006.01)
(52) U.S. Cl. .................... 427/248.1; 118/715
(58) Field of Classification Search .................. 118/715; 427/248.1
See application file for complete search history.

(56) References Cited

U.S. PATENT DOCUMENTS

| | | |
|---|---|---|
| 4,369,031 A | 1/1983 | Goldman et al. |
| 4,612,077 A | 9/1986 | Tracy et al. |
| 4,761,269 A | 8/1988 | Conger et al. |
| 4,793,283 A | 12/1988 | Sarkozy |
| 4,854,263 A | 8/1989 | Chang et al. |
| 4,902,572 A | 2/1990 | Horne et al. |
| 4,980,204 A | 12/1990 | Fujii et al. |
| 5,024,182 A | 6/1991 | Kobayashi et al. |
| 5,183,510 A | 2/1993 | Kimura |
| 5,221,556 A | 6/1993 | Hawkins et al. |
| 5,250,323 A | 10/1993 | Miyazaki |
| 5,269,847 A | 12/1993 | Anderson et al. |
| 5,304,247 A | 4/1994 | Kondo et al. |
| 5,413,671 A | 5/1995 | Ketchum |
| 5,453,124 A | 9/1995 | Moslehi et al. |
| 5,455,070 A | 10/1995 | Anderson et al. |
| 5,540,772 A | 7/1996 | McMillan et al. |
| 5,551,982 A | 9/1996 | Anderson et al. |
| 5,582,866 A | 12/1996 | White |
| 5,702,530 A | 12/1997 | Shan et al. |
| 5,826,607 A | 10/1998 | Knutson et al. |
| 5,849,092 A | 12/1998 | Xi et al. |
| 5,888,907 A | 3/1999 | Tomoyasu et al. |
| 5,948,168 A | 9/1999 | Shan et al. |
| 5,948,958 A | 9/1999 | Bang et al. |
| 5,976,261 A | 11/1999 | Moslehi et al. |
| 6,003,535 A | 12/1999 | Ollivier |
| 6,022,412 A | 2/2000 | Vincenzo et al. |
| 6,143,079 A | 11/2000 | Halpin |
| 6,143,080 A | 11/2000 | Bartholomew et al. |
| 6,162,323 A | 12/2000 | Koshimizu |
| 6,217,659 B1 | 4/2001 | Botelho et al. |

(Continued)

FOREIGN PATENT DOCUMENTS

JP        01-305524        12/1989

(Continued)

*Primary Examiner* — Bret Chen
*Assistant Examiner* — Elizabeth Burkhart
(74) *Attorney, Agent, or Firm* — Knobbe, Martens Olson & Bear LLP

(57) ABSTRACT

A reaction apparatus for a semiconductor fabrication apparatus, wherein the reaction apparatus includes at least two adjustable outlet ports for withdrawing reactant gases from the reaction chamber. Adjustment of the flow rate through each of the outlet ports selectively modifies the flow pattern of the reactant gases within the reaction chamber to maintain a desired flow pattern therewithin, such as a substantially uniform flow over the surface of a substrate being processed, and/or minimization of turbulence within the reactor.

6 Claims, 6 Drawing Sheets

U.S. PATENT DOCUMENTS

| | | |
|---|---|---|
| 6,328,221 B1 | 12/2001 | Moore et al. |
| 6,333,272 B1 | 12/2001 | McMillin et al. |
| RE37,546 E | 2/2002 | Mahawili |
| 6,347,749 B1 | 2/2002 | Moore et al. |
| 6,352,594 B2 | 3/2002 | Cook et al. |
| 6,454,863 B1 | 9/2002 | Halpin |
| 6,572,924 B1 | 6/2003 | Halpin |
| 6,869,485 B2 | 3/2005 | Halpin |
| 2001/0009138 A1 | 7/2001 | Botelho et al. |
| 2001/0013363 A1 | 8/2001 | Kitayama et al. |
| 2002/0042205 A1 | 4/2002 | McMillin et al. |
| 2002/0185062 A1* | 12/2002 | Halpin ................. 118/50.1 |
| 2004/0035358 A1 | 2/2004 | Basceri et al. |
| 2004/0050326 A1 | 3/2004 | Thilderkvist et al. |
| 2004/0107897 A1 | 6/2004 | Lee et al. |
| 2006/0144333 A1 | 7/2006 | Doan et al. |
| 2006/0216417 A1 | 9/2006 | Todd |
| 2007/0207625 A1 | 9/2007 | Aggarwal |

FOREIGN PATENT DOCUMENTS

| | | |
|---|---|---|
| JP | 03131594 | 6/1991 |
| JP | 06151338 | 5/1994 |
| WO | WO 89/12703 | 12/1989 |

* cited by examiner

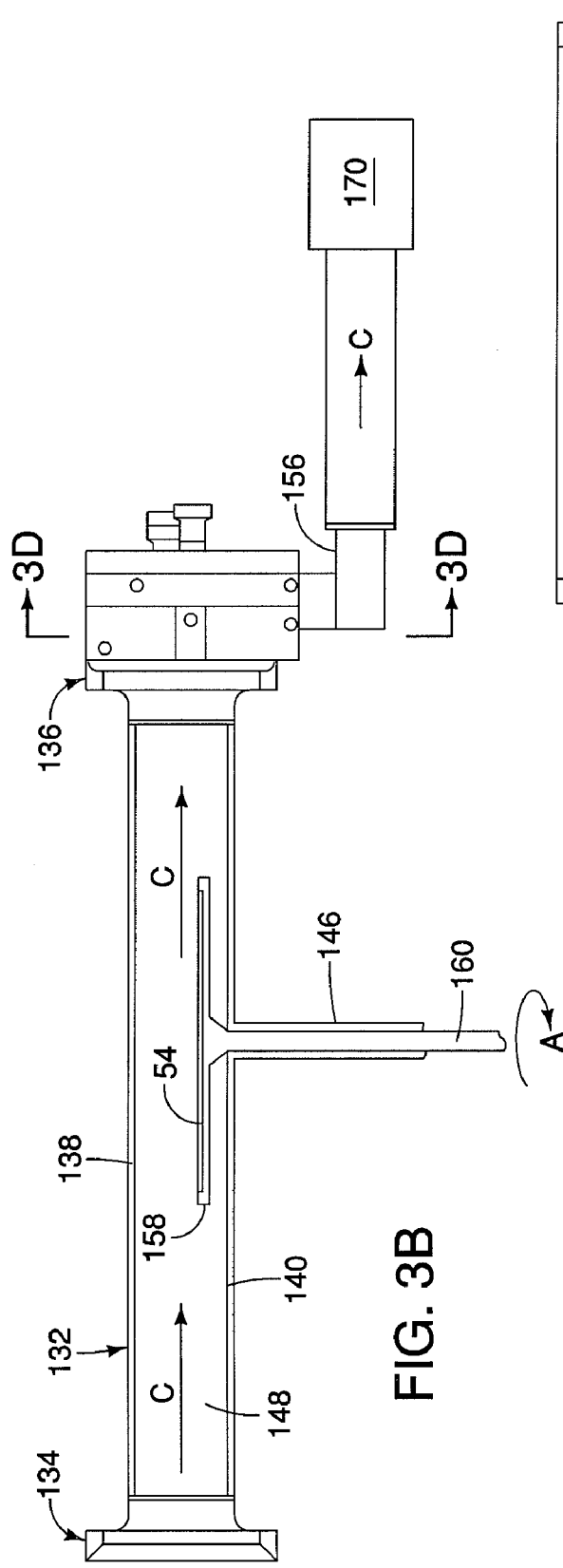
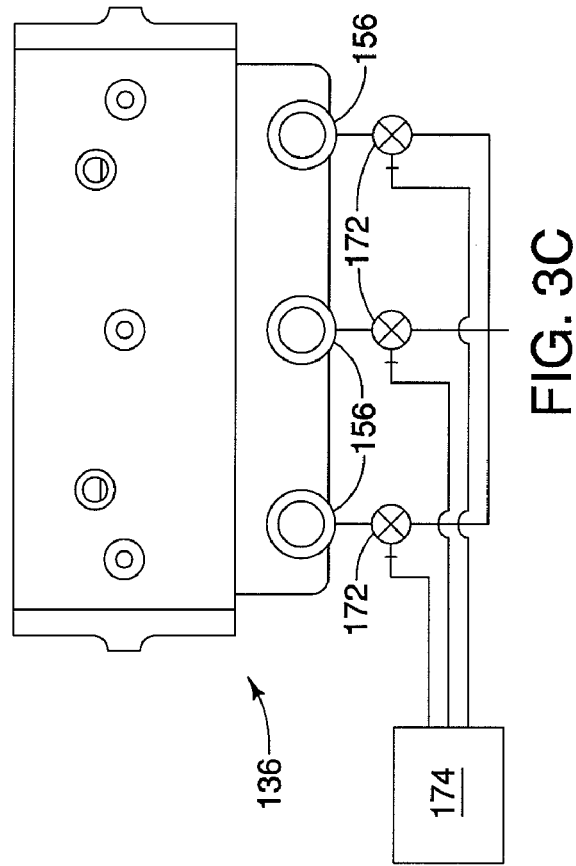
FIG. 3B
FIG. 3C

REACTION APPARATUS HAVING MULTIPLE ADJUSTABLE EXHAUST PORTS

FIELD OF THE INVENTION

This invention relates to the manufacture and fabrication of semiconductor devices, and more particularly, this invention relates to methods and structures for controlling the flow pattern within a reaction chamber of a semiconductor processing apparatus.

BACKGROUND OF THE INVENTION

In the processing of semiconductor devices, such as transistors, diodes, and integrated circuits, a plurality of such devices are typically fabricated simultaneously on a thin slice of semiconductor material, termed a substrate, wafer, or workpiece. In one example of a semiconductor processing step during manufacture of such semiconductor devices, the wafer or other workpiece is typically transported into a reaction chamber in which a thin film, or layer, of a material is deposited on an exposed surface of the wafer. Once the desired thickness of the layer of semiconductor material has been deposited the surface of the wafer, the wafer may be further processed within the reaction chamber, transported out of the reaction chamber for packaging, or transported out of the reaction chamber for further processing.

Known methods of depositing a film of a semiconductor material onto a surface of a wafer include, but are not limited to: (atmospheric and low-pressure) vapor deposition, sputtering, spray-and-anneal, and atomic layer deposition. Chemical Vapor Deposition ("CVD"), one process for fabricating semiconductor devices, is the formation of a stable compound on a heated wafer, or substrate, by the thermal reaction or decomposition of certain gaseous compounds within a reaction chamber. Epitaxial growth is a highly specific type of CVD that requires that the crystal structure of the substrate or wafer be continued through the deposited layer. The reaction chamber provides a controlled environment for safe deposition of stable compounds onto the substrate.

A reaction chamber may be formed of quartz, stainless steel, aluminum, or any other material sufficient to be substantially non-reactive with respect to the reactant gases introduced therein. One commercial epitaxial deposition reaction chamber includes a horizontal flow system in which wafers are placed horizontally on a susceptor and reactant gases flow horizontally in one end of the reaction chamber, across the wafer(s), and out the other end of the chamber. Two types of reaction chambers typically used in CVD processes are cold-wall reaction chambers and hot-wall reaction chambers. Cold-wall reaction chambers are formed of materials in which the walls of the reaction chamber are maintained at a reduced temperature relative to the substrate being processed, for example by actively cooling the reaction chamber walls. Heating the wafer in a cold-wall CVD system is typically accomplished through the use of radiant heat of wavelengths absorbed by the substrate or substrate holder, but the walls of the reaction chamber are largely transparent to the radiant energy wavelengths. Other heating mechanisms can also be used. Hot-wall reaction chambers are formed of materials in which the walls of the chamber are heated while the wafer being processed is simultaneously heated. The walls of the hot-wall reaction chamber are typically closer to the temperature of the substrate being processed relative to the temperature difference in cold-wall reaction chambers.

The reaction chamber used in horizontal CVD systems generally includes at least one inlet port that introduces reactant gases into the reaction chamber and a single outlet port for removal of the reactant gases and by-products that result from chemical reactions between the reactant gases and the exposed surface of the wafer being processed. The reactant gases typically contain chemicals or compounds for providing a material deposition on the wafer in the form of a thin film layer. The reactant gases may also include chemicals or compounds for removing, or etching, a portion of the surface of the bare wafer or a portion of the surface of a deposited thin film, such as in selective deposition processes.

During deposition of a thin film layer on the surface of the wafer, the exhaust, or by-products, from the chemical reaction and any excess reactant gases that were previously introduced into the reaction chamber are continually removed therefrom. The exhaust and excess reactant gases are typically withdrawn from the reaction chamber by way of the outlet port. The excess reactant gases and the exhaust from the chemical reaction can be removed from the reaction chamber as a result of a pressure differential caused by the reactant gases being input into the reaction temperature at a pressure greater than the pressure downstream from the reaction chamber. In the alternative, a vacuum can be operatively connected to the outlet port, whereby the exhaust and excess reactant gases are withdrawn from the reaction chamber by a suction force.

With conventional reaction chambers, the flow pattern within the reaction chamber may develop turbulence along the walls or corners of the reaction chamber. The flow turbulence can reduce or eliminate the amount of reactant gases at localized areas within the reaction chamber, which is particularly problematic in the areas adjacent to, or above, the exposed surface of the workpiece being processed. The turbulence of the reactant gases may cause a reduced amount of reactant gases flowing across portions of the wafer within the reaction chamber. Non-laminar flow and laminar flow may both create areas or regions of a reduced amount of reactant gases flowing across portions of the wafer within the reaction chamber. Any type of flow of reactant gases within the reaction chamber that would cause reduced or lack of reactant gases flowing across areas of a wafer reduce the likelihood of an even deposition across the entire surface of the wafer. Recirculation caused by turbulence can affect not only the uniformity of the deposition but can also create contamination problems.

SUMMARY OF THE INVENTION

A need therefore exists to allow a user to control or modify the profile of the gas flow in the reaction chamber to provide substantially uniform distribution of reactant gases across the entire surface of a wafer and reduce the amount of areas receiving a reduced amount or lack of reactant gases. In one aspect of the present invention, a reaction apparatus for use in a semiconductor fabrication apparatus is provided. The reaction apparatus includes a reaction chamber having a first distal end and a second distal end. The reaction apparatus further includes an inlet manifold operatively connected to the first distal end of the reaction chamber. The inlet manifold is configured to introduce reactant gases into the reaction chamber. The reaction apparatus also includes an outlet manifold operatively connected to the second distal end of the reaction chamber. The outlet manifold includes at least two outlet ports from which the gases can exit the reaction chamber. The reaction chamber, inlet manifold and outlet manifold define a flow pattern through the reaction chamber. Each of the outlet ports configured to provide an adjustable flow rate therethrough.

In another aspect of the present invention, a method for selectively modifying a flow pattern of reactant gases within a reaction chamber is provided. The method includes providing a reaction chamber for performing semiconductor fabrication processes. The method further includes introducing reactant gases into the reaction chamber. The reaction chamber has a first distal end and a second distal end, and the reactant gases flow from the first distal end to the second distal end to form a flow pattern within the reaction chamber. The method also includes withdrawing the reactant gases from the second distal end of the reaction chamber through at least two outlet ports. The method further includes selectively adjusting the flow rate of at least one of the outlet ports to change the flow pattern within the reaction chamber.

According to another aspect of the present invention, an apparatus for performing a semiconductor fabrication process is provided. The apparatus includes a reaction chamber having a first distal end and an opposing second distal end. A susceptor is disposed within the reaction chamber, and the susceptor is configured to receive at least one wafer. An inlet manifold is operatively connected to the first distal end of said reaction chamber. The inlet manifold is configured to introduce reactant gases into the reaction chamber through the first distal end. An outlet manifold is operatively connected to the second distal end of said reaction chamber. The outlet manifold is configured to allow reactant gases to exit from the reaction chamber through the second distal end, wherein a flow pattern is defined between the first distal end and the second distal end. The apparatus further includes a plurality of outlet ports extending from the outlet manifold. The reactant gases exit the reaction chamber and pass through at least two of the outlet ports, and each of the outlet ports are configured to provide an adjustable flow rate therethrough. An adjustable flow control device is operatively connected to each of the outlet ports, wherein adjustment of at least one flow control device causes the flow pattern within the reaction chamber to be modified.

Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF THE DRAWINGS

FIG. 3B is a side view of the reaction apparatus of FIG. 3A;
FIG. 3C is an end view of the reaction apparatus of FIG. 3A with control features indicated schematically.

DETAILED DESCRIPTION OF THE PREFERRED EMBODIMENT

Figure 1:
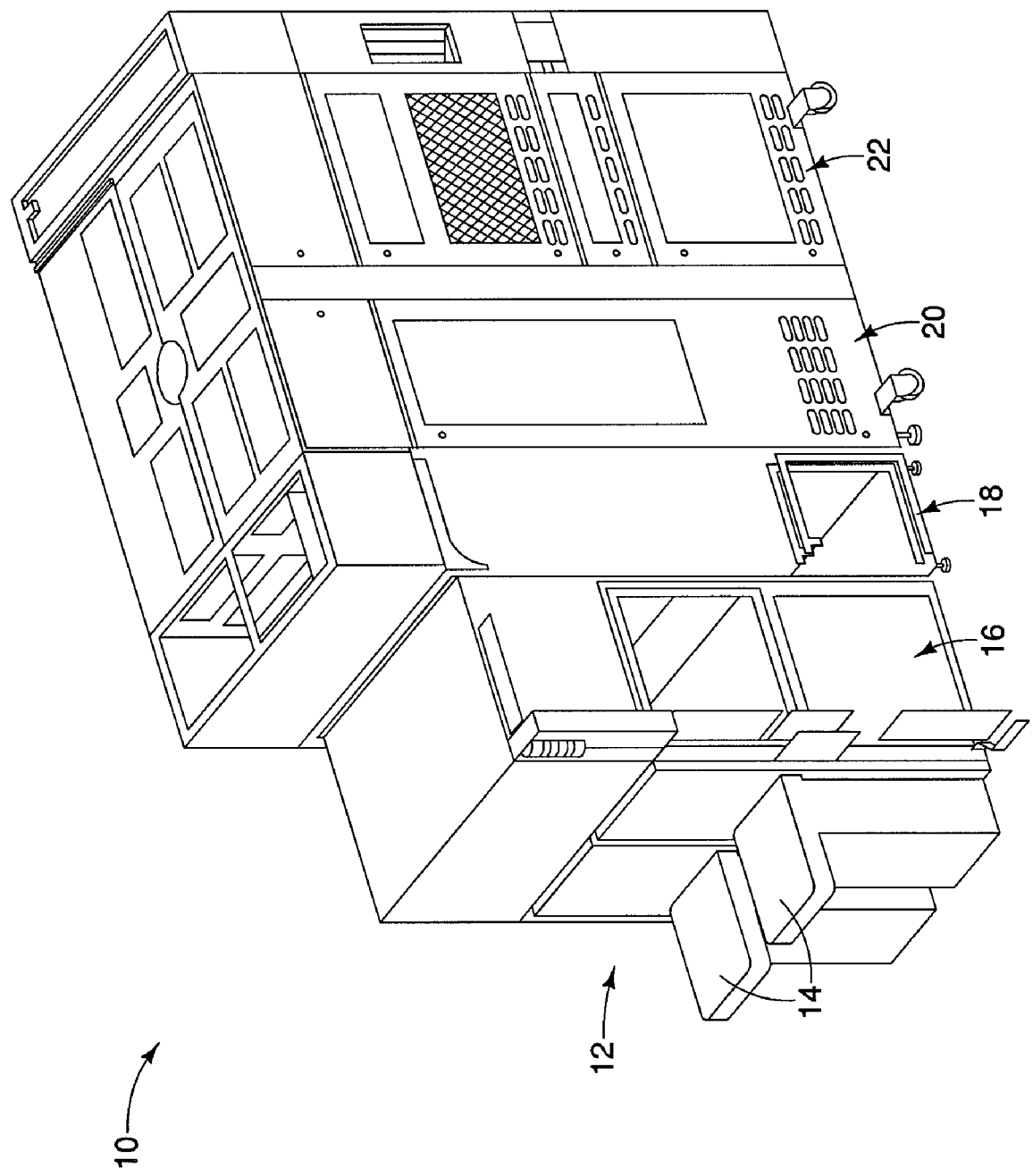
FIG. 1 is an exemplary embodiment of a semiconductor fabrication apparatus.

Referring to FIG. 1, an exemplary embodiment of a semiconductor fabrication apparatus 10 is shown. An example of a suitable commercially available semiconductor fabrication apparatus 10 is the Epsilon® series of tools provided by ASM America, Inc. of Phoenix, Ariz. The semiconductor fabrication apparatus 10 is configured to deposit a thin film, or layer, of a material onto substrates. In an embodiment, the deposition of the thin film is by way of chemical vapor deposition ("CVD"). However, it should be understood by one skilled in the art that the semiconductor fabrication apparatus 10 can be used for semiconductor fabrication using any material deposition process including, but not limited to, atomic layer deposition. The terms "semiconductor wafer," "substrate," and/or "wafer" as used herein refers to a substrate as it may exist in any of the various stages of the semiconductor fabrication process.

In an embodiment, the semiconductor fabrication apparatus 10 includes a front-end interface 12, wafer cassette load port platforms 14, a wafer transport chamber 16, a load lock housing 18, a wafer handling chamber 20, and a reactor compartment 22, as shown in FIG. 1. The front-end interface 12 provides user access to the apparatus. The front-end interface includes a graphical user interface (not shown) that allows the user to control and adjust the fabrication process. The front-end interface 12 further includes at least one wafer cassette load port platform 14. Each load port platform 14 is configured to receive a cassette (not shown) containing multiple wafers that are to be fabricated. The wafers (not shown) are transferred from the load port platform 14 to the load lock housing 18 by way of a wafer handling apparatus (not shown) located within the wafer transport chamber 16.

Figure 2A:
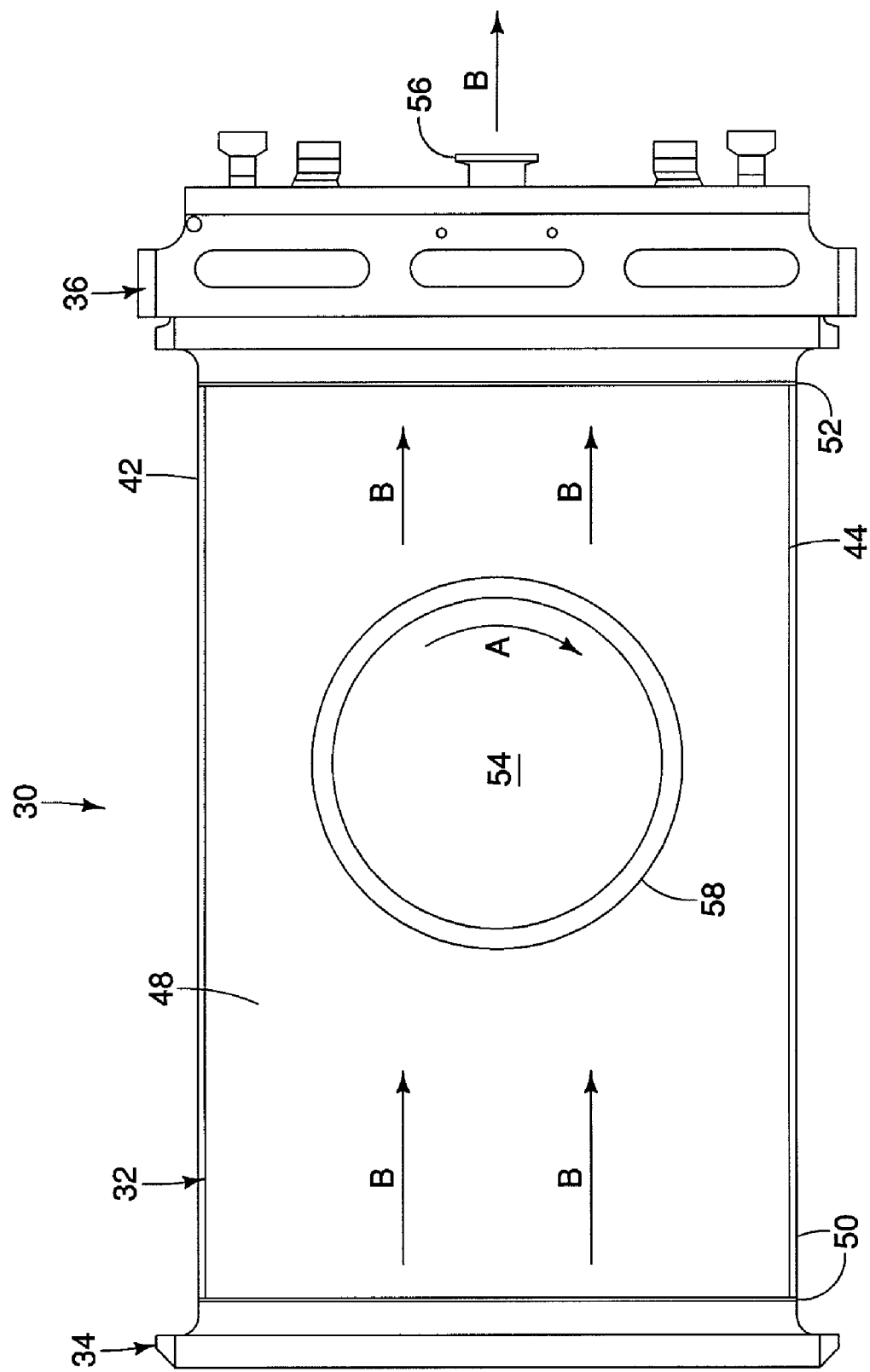
FIG. 2A is a top view of an embodiment of a prior art reaction apparatus.
Figure 2B:
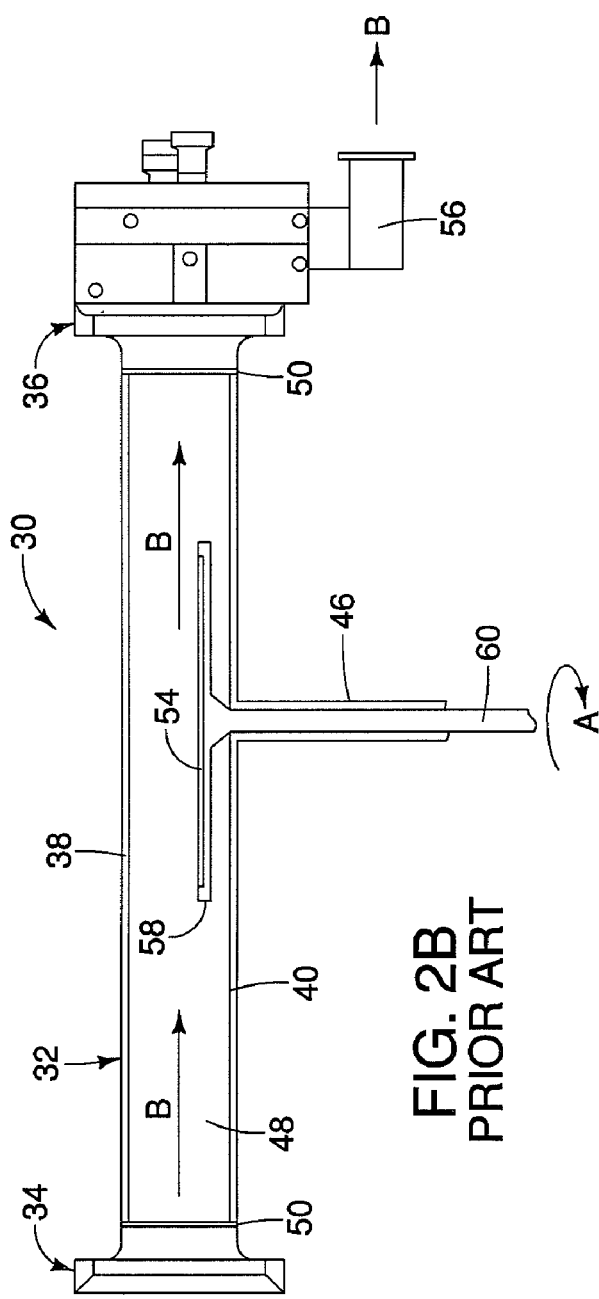
FIG. 2B is a side view of the reaction apparatus of FIG. 2A.
Figure 2C:
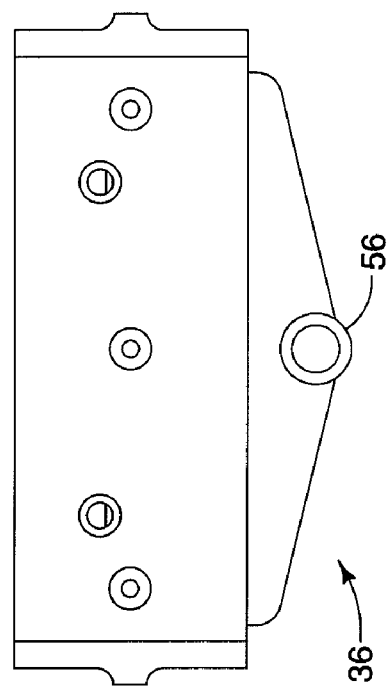
FIG. 2C is an end view of the reaction apparatus of FIG. 2A.

In an embodiment, the reactor compartment 22 includes at least one reaction apparatus. A prior art reaction apparatus 30 is illustrated in FIGS. 2A-2C. The reaction apparatus 30 includes a reaction chamber 32, an inlet manifold 34, and an outlet manifold 36. The reaction chamber 32 includes an upper wall 38, a lower wall 40, a first side wall 42, a second side wall 44, and a hollow tube 46 extending downwardly from the lower wall 40, thereby forming an enclosed reaction space 48 therewithin. In an embodiment, the reaction chamber 32 is formed of transparent quartz.

The inlet manifold 34 is operatively attached to the reaction chamber 32 at a first distal end 50 of the reaction chamber 32, as shown in FIGS. 2A-2B, for introducing reactant gases into the reaction space 48. The outlet manifold 36 is operatively attached to the reaction chamber 32 at a second distal end 52 of the reaction chamber 32 for withdrawing excess reactant gases as well as the by-products of the reaction between the reactant gases and a substrate or wafer 54 within the reaction space 48. Excess reactant gases and by-products can be collectively referred to as effluent gases that exit the chamber at the second distal end 52 of the reaction chamber 32. In an embodiment, the second distal end 52 of the reaction chamber 32 includes a single outlet aperture (not shown) that communicates with the outlet manifold 36. The excess reactant gases and by-products are transferred from the outlet aperture of the reaction chamber 32 through the outlet manifold 36 to an exhaust system (not shown) by way of a single outlet port 56.

The substrate or wafer 54 is supported by a substrate support in the form of a susceptor 58 within the reaction space 48 of the reaction chamber 32, as shown in FIGS. 2A-2B. The susceptor 58 is operatively supported by a susceptor support 29 that is connected to a shaft 60 distending downwardly, and the shaft 60 is received within the hollow tube 46 of the reaction chamber 32. The susceptor 58 is configured to receive a substrate 54 from the load lock housing 18 such that the substrate 54 is positioned centrally upon the upper surface of the susceptor 58. The shaft 60 of the susceptor 58 is operatively connected to a motor (not shown) that selectively rotates the shaft 60 and susceptor 58. Rotation of the susceptor 58 results in corresponding rotation of the substrate 54 supported thereon, as illustrated by arrow A in FIGS. 2A-2B.

In operation, a substrate 54 is transferred from the load lock housing 18 (FIG. 1) onto the susceptor 58 within the reaction space 48 of the reaction chamber 32. Once the substrate 54 is positively located on the susceptor 58, the motor (not shown) causes the susceptor 58 and substrate 54 to rotate within the reaction chamber 32. As the substrate 54 is rotated, reactant gases are introduced into the reaction space 48 by way of the inlet manifold 34. The reactant gases flow in a substantially linear manner from the inlet manifold 34, across the upper surface of the substrate 54, through the outlet manifold 36, and exits through the outlet port 56. The flow of the reactant gases within the reaction chamber 32 is illustrated by arrow B in FIGS. 2A-2B. The flow pattern of the reactant gases and by-products through the reaction chamber 32 may become turbulent in locations near the first and second side walls 42, 44 of the reaction chamber 32 and extend over portions of the exposed surface of the substrate 54 being processed. The turbulent flow of reactant gases within the reaction chamber 32 may cause a reduced or an absence of the reactant gases across portions of the surface of the substrate 54 being processed. The reduced or an absence of the reactant gases across portions of the substrate 54 may cause reduced or uneven deposition of the desired materials onto the surface of the substrate 54, thereby reducing the effective processing of portions of the substrate 54. While the present description is directed to deposition of thin films on a substrate, one skilled in the art should understand that even distribution of gases over a substrate surface in other processes such as etching, annealing, doping, oxidizing, or any other process may also be desired.

An improved reaction apparatus 100 configured to reduce or eliminate areas in which the reactant gases are reduced or have a lack thereof within the reaction chamber 132 is shown in FIGS. 3A-3E. The reaction apparatus 100 is configured to be disposed within the reactor compartment 22 (FIG. 1) of the semiconductor fabrication apparatus 10. In an embodiment, the reaction apparatus 100 is configured as a horizontal flow, cold-wall reactor for performing deposition of a thin film, or layer, of a semiconductor material onto a substrate 54 or removing a portion of the surface of a previously deposited layer of a semiconductor material. It should be understood by one skilled in the art that the reaction apparatus 100 may also be configured as a hot-wall reactor. The reaction apparatus 100 can be configured to perform semiconductor fabrication processes at about atmospheric pressure, above atmospheric pressure, below atmospheric pressure, or multiple successive processes at different pressures.

Figure 3A:
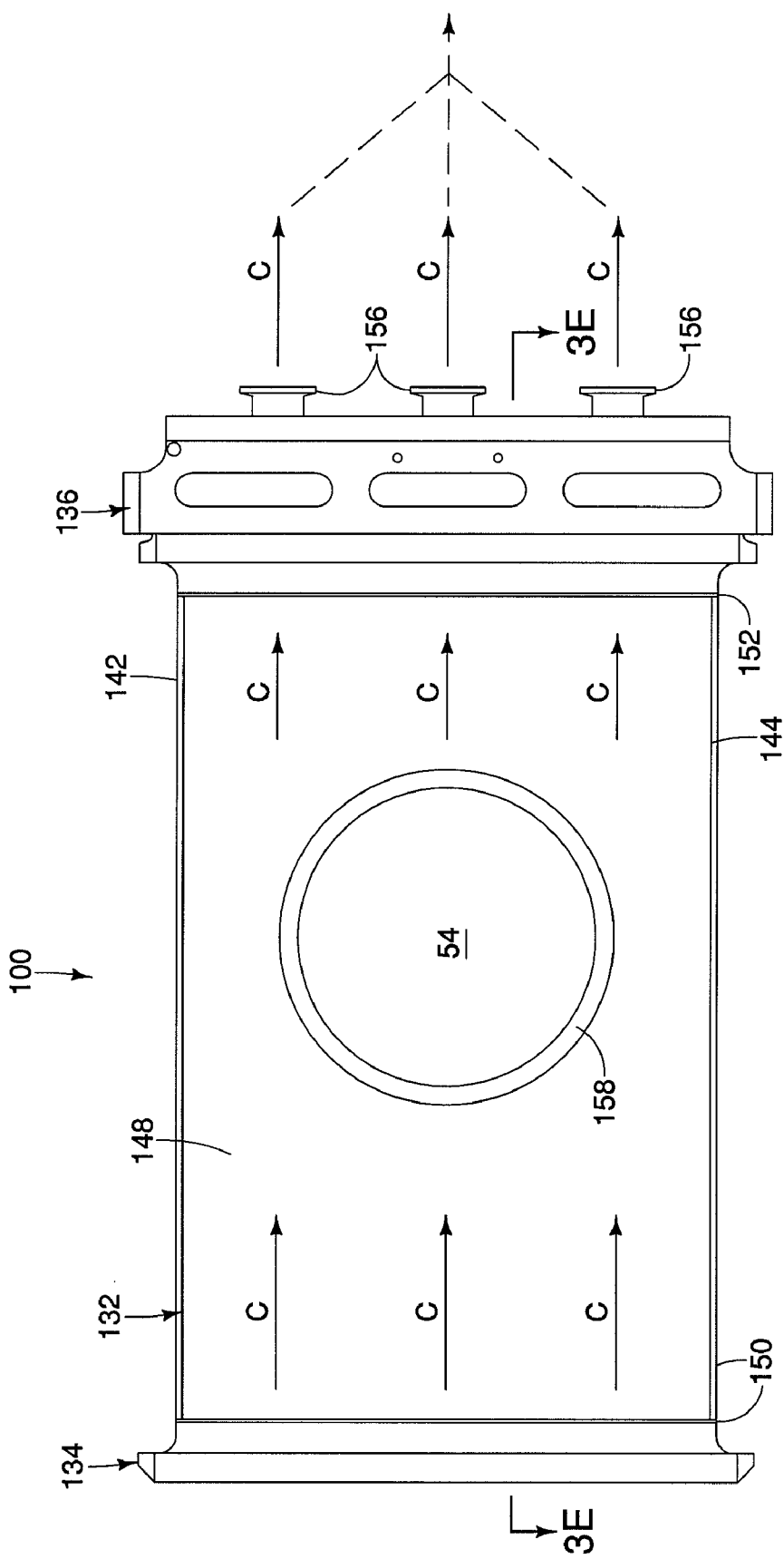
FIG. 3A is top view of an embodiment of an improved reaction apparatus in accordance with the present disclosure.

In an embodiment, the reaction apparatus 100 includes a reaction chamber 132, an inlet manifold 134, and an outlet manifold 136, as shown in FIGS. 3A-3C. The inlet manifold 134 is operatively connected to the first distal end 150 of the reaction chamber 132, and the outlet manifold 136 is operatively connected to the second distal end 152 of the reaction chamber 132. The inlet manifold 134 is configured to introduce reactant gases into the reaction chamber 132 through the first distal end 150 of the reaction chamber 132, and the reactant gases are configured to exit the reaction chamber 132 through the outlet manifold 136 by way of the second distal end 152 of the reaction chamber 132. The inlet manifold 134 and the outlet manifold 136 are aligned such that the reactant gases flow from the inlet manifold 134 toward the outlet manifold 136, the inlet manifold 134 and the outlet manifold 136 being operatively connected to opposing distal ends of the reaction chamber 132.

The reactant gases may be a source gas containing silicon-containing compounds that are adapted to chemically react with the substrate 54 to deposit a thin film of a semiconductor material thereon, or the reactant gases may include an etchant containing compounds that are adapted to chemically react with the substrate 54 to remove a portion of a thin film previously deposited on the substrate 54. It should be understood by one skilled in the art that the reactant gases may include a source gas, an etchant, a carrier gas, or any combination of gases configured to react with the exposed surface of the substrate 54. The reactant gases flow along the path indicated by the arrows C in FIGS. 3A-3B and 3E.

In an embodiment, the reaction chamber 132 includes an upper wall 138, a lower wall 140, a first side wall 142, a second side wall 144, and a hollow tube 146 distending downwardly from the lower wall 140, thereby forming an enclosed reaction space 148 therewithin, as shown in FIGS. 3A-3B. In an embodiment, the reaction chamber 132 walls are formed of transparent quartz to allow radiant heat from heat lamps (not shown) to pass through and heat the substrate 54, but it should be understood by one skilled in the art that the reaction chamber 132 may be formed of aluminum, titanium, stainless steel, or any other material substantially non-reactive with respect to the reactant gases introduced therein.

As shown in FIGS. 3A-3B, a substrate support in the form of a susceptor 158 is located within the reaction space 148. The susceptor 158 is configured to receive and support a substrate 54 during the fabrication processes within the reaction chamber 132. The susceptor 158 is operatively supported by a susceptor support 159 that is connected to a shaft 160 distending downwardly, wherein the shaft 160 is received within the hollow tube 146 of the reaction chamber 132. The shaft 160 is operatively connected to a motor (not shown) or other driving means for causing the shaft 160 and susceptor 158 to rotate. Rotation of the shaft 160 and the susceptor 158 results in corresponding rotation of the substrate 54 supported on the susceptor 158.

Figure 3D:
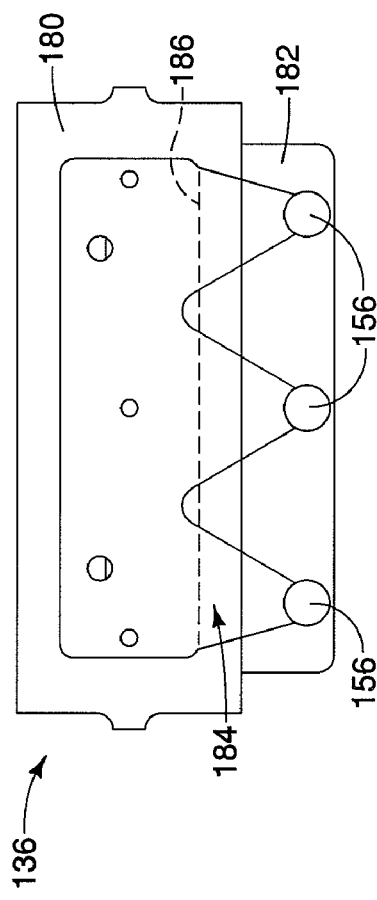
FIG. 3D is a cross-sectional view of the reaction apparatus taken along line 3D-3D in FIG. 3B.
Figure 3E:
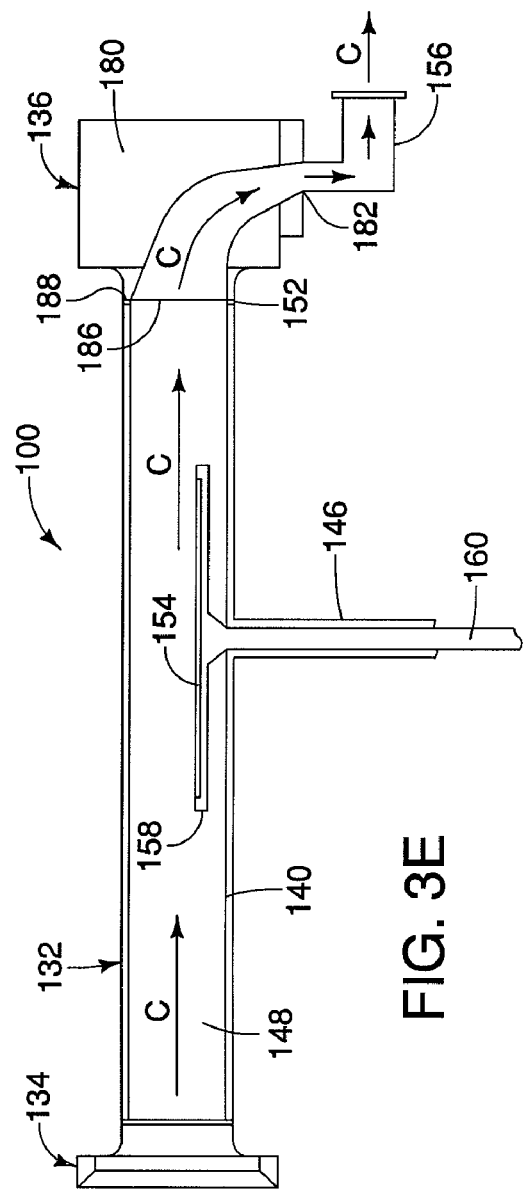
FIG. 3E is a cross-sectional view of the reaction apparatus taken along line 3E-3E of FIG. 3A.

The outlet manifold 136 is configured to allow excess reactant gases as well as the by-products, or exhaust, resulting from the chemical reaction between the reactant gases and the substrate 54 to exit the reaction chamber 132, as shown in FIGS. 3A-3B and 3E. The outlet manifold 136 includes an inlet aperture (not shown) that corresponds and substantially aligns with the outlet aperture (not shown) at the second distal end 152 of the reaction chamber 132. The outlet manifold 136 further includes at least two outlet ports 156 through which the excess reactant gases and by-products exit the outlet manifold 136. In the illustrated embodiment, the outlet manifold 136 includes three outlet ports 156. It should be understood by one skilled in the art that the outlet manifold 136 may include any number of outlet ports 156 sufficient to accurately maintain substantially uniform flow of the reactant gases over the surface of the substrate 54 disposed within the reaction chamber 132. When the outlet manifold 136 includes a plurality of outlet ports 156, it should be understood by one skilled in the art that the flow rate through each of the outlet ports 156 can be selectively adjusted such that the reactant gases and by-products can exit through all of the plurality of outlet ports 156, or the reactant gases and by-products can exit through less than all of the plurality of outlet ports 156. For example, the illustrated embodiment includes three outlet ports 156, but the flow rate through one of the outlet ports may be adjusted such that there is no reactant gases or by-products flowing therethrough such that all of the excess reactant gases and by-products exit the reaction space 148 through the other two outlet ports 156. In this example, the effluent flow is through at least two of the plurality of outlet ports 156. The excess reactant gases and the by-products exiting the outlet ports 156 may be treated and recycled or transferred to a scrubber for processing.

In an embodiment, a single vacuum 170 is operatively connected to exhaust ports 156 of the outlet manifold 136 to create a pressure differential, or suction force, within the reaction chamber 132. The suction force within the reaction chamber 132 causes the reactant gases introduced through the inlet manifold 134 to flow from the inlet manifold 134, across the substrate 54, and be withdrawn through the outlet manifold 136. In another embodiment, each outlet port 156 is operatively connected to a separate vacuum 170 that is configured to create a pressure differential, or suction force, within the reaction chamber 132.

The reaction chamber 132 can be configured to perform various processes associated with fabricating a semiconductor wafer at different pressures within the reaction chamber 132. In an embodiment, the reaction chamber 132 is configured to perform fabrication processes at about atmospheric pressure within the reaction chamber 132. In another embodiment, the reaction chamber 132 is configured to perform fabrication processes at a reduced pressure, or a pressure less than atmospheric pressure within the reaction chamber 132. An example of reduced processing pressures is in the range of 1-100 Torr. In yet another embodiment, the reaction chamber 132 is configured to perform fabrication processes at an increased pressure, or a pressure greater than atmospheric pressure within the reaction chamber 132. It should be understood by one skilled in the art that the structure of the reaction chamber 132 may be configured for any type of fabrication process at either one or more pressures therewithin.

In an embodiment, the reaction space 148 within the reaction chamber 132 is maintained at substantially atmospheric pressure for performing fabrication processes at about atmospheric pressure. The inlet manifold 134 introduces reactant gases into the reaction chamber 132 at a pressure greater than the pressure within the reaction chamber 132, thereby forcing the reactant gases to flow across the surface of the substrate 54 and out through the outlet ports 156 of the outlet manifold 136, as illustrated by arrows C in FIGS. 3A-3B. The pressure differential between the reactant gases introduced into the reaction chamber 132 via the inlet manifold 134 and the pressure within the reaction chamber 132 causes the reactant gases to flow from the inlet manifold 134 to the outlet manifold 136.

In another embodiment, at least one vacuum 170 is operatively connected to the outlet ports 156, as shown in FIG. 3B, thereby creating reduced pressure within the reaction chamber 132 and a suction force acting toward the outlet manifold 136. When reactant gases are introduced into the reaction chamber 132 through the inlet manifold 134, the suction force causes the reactant gases to flow from the inlet manifold 134 to the outlet manifold 136 and out the outlet ports 156. In operation, the reactant gases enter the reaction chamber 132 through the inlet manifold 134, pass over the substrate 54, and exit through at least one outlet port 156 of the outlet manifold 136.

In an embodiment, each outlet port 156 is operatively connected to a separate vacuum 170 for withdrawing excess reactant gases and by-product from the particular outlet port 156, thereby separating these effluent gases being withdrawn from the reaction chamber 132 into separate effluent flows. In another embodiment, each of the outlet ports 156 is operatively connected to a single vacuum 170 configured to withdraw excess reactant gases and by-products from the reaction space 148 through all of the outlet ports 156. Accordingly, once the excess reactant gases and by-products have been withdrawn from the reaction chamber 132 via the plurality of outlet ports 156, the withdrawn gases are subsequently combined downstream into a single exhaust stream controlled by the single vacuum 170. It should be understood by one skilled in the art that any number of vacuums may be connected to the outlet ports 156 in any configuration sufficient to provide a suction force within the reaction chamber 132.

In an exemplary embodiment, the outlet manifold 136 includes three outlet ports 156, as illustrated in FIG. 3C. Although FIGS. 3A-3E illustrate an outlet manifold 136 having three outlet ports 156, it should be understood by one skilled in the art that the outlet manifold 136 may have two or more outlet ports 156 extending therefrom for allowing reactant gases and by-products to be withdrawn from the reaction chamber 132. The number of outlet ports 156 should be sufficient to provide sufficient control of excess reactant gases and exhaust by-products exiting the reaction chamber to modify the flow pattern of gases within the reaction chamber 132 for providing a desired distribution of gases over the exposed surface of the substrate 54 disposed within the reaction chamber 132. Typically the desired distribution will be a uniform distribution of reactant gas flow across the substrate and minimization of turbulence. Each of the outlet ports 156 is in fluid communication with the reaction space 148 of the reaction chamber 132. The outlet ports 156 are configured to allow the reactant gases and the by-products, or exhaust, resulting from the chemical reaction between the reactant gases and the substrate 54 to exit the reaction chamber 132.

In an embodiment, a flow control device 172 is operatively connected to each of the outlet ports 156 of the outlet manifold 136, as illustrated in FIG. 3C. A flow control device 172 may include, but is not limited to, a valve, an orifice, or any other device or configuration sufficient to control the flow of reactant gases exiting the reaction chamber 132. The flow control devices 172 allow a user to selectively adjust the flow rate of reactant gases and exhaust through each of the outlet ports 156. In an embodiment, each of the flow control devices 172 is controllable independent of the other flow control devices 172. In another embodiment, the flow control devices 172 are controlled simultaneously such that adjustment of one flow control device 172 correspondingly adjusts the other flow control devices 172 in the same, or similar, manner. The flow control devices 172 include throttling capabilities which allow each flow control device 172 to increase or decrease the flow rate of gases through the corresponding outlet port 156, and thus adjust the flow pattern of gases within the reaction space 148. The flow control devices 172 may be pneumatically controlled cylinder valves, or any other valve sufficient to selectively control or modify the flow rate of gases through a corresponding outlet port 156.

In an embodiment, the flow control devices 172 are operatively connected to the outlet ports 156 and located within the outlet manifold 136. In another embodiment, the flow control devices 172 are operatively connected to the outlet ports 156 and located external to the outlet manifold 136. In yet another embodiment at least two flow control devices 172 are operatively connected to at least one of the outlet ports 156. It should be understood by one skilled in the art that any number of flow control devices 172 can be operatively connected at any location to the outlet ports 156 to provide control of the flow rate reactant gases and exhaust by-products exiting the reaction chamber 132. The flow control devices 172 are configured to be adjusted in concert or individually to modify the flow pattern of gases within the reaction chamber 132 to provide a desired distribution of reactant gases across the exposed surface of the substrate 54 within the reaction chamber 132. Typically the desired distribution will be a substantially uniform distribution of reactant gases across the exposed surface of substrate 54.

In an embodiment, each of the flow control devices 172 is operatively connected to a controller 174, as shown in FIG. 3C. The controller 174 is configured to control the throttling capabilities of each of the flow control devices 172 for adjusting the flow rate of gases through the corresponding outlet port 156. In an embodiment, the flow control device 172 is manually controlled by a user. In another embodiment, the flow control device 172 is automatically controlled according to feedback data received. Because an even distribution of reactant gases across the substrate 54 can produce a more uniform deposition of a thin film on the surface of the substrate 54, the flow control device 172 is configured to selectively control the flow rate through each of the individual outlet ports 156 to optimize the flow of reactant gases between the inlet manifold 134 and the outlet manifold 136 to eliminate the areas of turbulent flow that result in reduced areas of reactant gases across portions of the exposed surface of the substrate 54. Reducing the areas of turbulence in the gas flow will typically result in a more even distribution of reactant gases across the exposed surface of the substrate 54 within the reaction space 148.

As noted above, the desired distribution will often be substantially uniform distribution of gases across the substrate 54 in order to provide substantially uniform process results across the substrate 54. For example, when the temperature across the wafer is uniform, or when deposition takes place within the mass flow limited regime, uniform distribution of gases will often result in a uniform thickness of a layer deposited by CVD. On the other hand, in processes in which an uneven distribution of reactant gases across the substrate 54 is desired, e.g., to compensate for another process variable non-uniformity, the flow control devices 172 are adjustable to modify the flow of gases within the reaction space 148 to produce a desired distribution of reactant gases across the exposed surface of the substrate 54. For example, in some arrangements a non-uniform temperature distribution across a wafer can be compensated by a non-uniform distribution of reactant gas flow across the substrate to produce uniform process results, particularly uniform deposition rates or thicknesses. In practice, the technician can modulate the gas flow using the flow control devices 172 to achieve uniform process results on the substrate 54, without directly measuring whether the flow pattern over the wafer is uniform or non-uniform. Even in arrangements where a non-uniform distribution of gases is employed, the flow control devices 172 can be configured to modify the profile of the gases exiting the reaction chamber 156 in a selective manner to reduce or eliminate turbulence in the flow pattern of the gases within the reaction space 148. Thus, generally, the illustrated embodiment provides flexibility for modifying the profile of gases flowing out of the chamber in order to produce a desired flow pattern within the reaction space 148, such as minimized turbulence and/or uniform process result in on a substrate.

In an embodiment, the outlet manifold 136 includes an upper portion 180 and a lower portion 182, as illustrated in FIGS. 3D-3E. The upper portion 180 and lower portion 182 are formed as separate members and subsequently connected together to form the outlet manifold 136. In another embodiment, the upper and lower portions 180, 182 are formed as a one-piece member. It should be understood by one skilled in the art that the outlet manifold 136 may be formed of any number of members that are subsequently assembled to form the outlet manifold 136. The outlet manifold 136 includes a passageway 184 that fluidly connects the second distal end 152 of the reaction chamber 132 with each of the outlet ports 156. The passageway 184 includes an aperture 186 in the interface surface 188 of the outlet manifold 136. The aperture 186 (shown in dashed lines in FIG. 3D) is substantially the same size and shape of the exit aperture of the reaction chamber 132 at the second distal end 152 thereof. The upper portion 180 of the outlet manifold 136 is sealingly attached to the second distal end 152 of the reaction chamber 132 such that the aperture 186 of the passageway 184 provides a substantially smooth transition between the reaction chamber 132 and the outlet manifold 136.

In the illustrated embodiment, the passageway 184 within the outlet manifold 136 splits, or is divided, into three depending routes such that each of the three outlet ports 156 are in fluid communication with the passageway 184 extending from the aperture 186, as shown in FIG. 3D. The outlet ports 156 extend downwardly from the lower portion 182 of the outlet manifold 136 such that the flow path from each of the outlet ports 156 is vertically offset relative to the flow path of the reactant gases and by-products within the reaction space 148. In another embodiment, the outlet ports 156 are substantially aligned with the flow path of the reactant gases within the reaction space 148 such that the gases flow from the inlet manifold 134, through the reaction space 148, through the outlet manifold 136, and out the outlet ports 156 in a substantially linear manner. It should be understood by one skilled in the art that the relative position of the outlet ports 156 may be located at any position relative to the direction of flow of the reactant gases and by-products between the opposing distal ends 150, 152 of the reaction chamber 132.

Referring to FIG. 3E, the passageway 184 extends downwardly from the aperture 186 through the outlet manifold 136. The passageway 184 is in fluid communication with each of the outlet ports 156 such that a portion of gases withdrawn from the reaction chamber 132 may exit the reaction apparatus 100 via each of the outlet ports 156. In an embodiment, each of the outlet ports 156 has substantially the same flow rate of excess reactant gases and exhaust by-products therethrough. In another embodiment, the flow control devices 172 (FIG. 3C) selectively control the flow rate through each of the outlet ports 156 such that the flow rate through at least one of the outlet ports 156 is different than the flow rate through another of the outlet ports 156. A change in flow rate through at least one of the outlet ports 156 results in a modification of the flow pattern within the reaction chamber 132. When the flow pattern of reactant gases becomes such that there are areas of turbulence within the reaction chamber 132 or areas within the reaction chamber 132 receiving a reduced amount of reactant gases, the flow control devices 172 are adjustable to modify the flow pattern of the reactant gases within the reaction chamber 132. Such a change in flow pattern of the reactant gases reduces areas of turbulent gas flow or eliminates the areas which receive a reduced amount or a complete lack of reactant gases flowing thereover. Accordingly, the altered flow pattern within the reaction chamber 132 provides a more even distribution of reactant gases over the surface of a substrate 54.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A method for selectively modifying a flow pattern of reactant gases within a reaction chamber, said method comprising:

providing a reaction chamber for performing semiconductor fabrication processes;

introducing reactant gases into said reaction chamber, said reaction chamber having a first distal end and an opposing second distal end, and said reactant gases flowing from said first distal end to said second distal end form a flow pattern within said reaction chamber;

withdrawing said reactant gases from said second distal end of said reaction chamber through at least two outlet ports located at said second distal end; and selectively adjusting a flow rate through at least one of said at least two outlet ports to maintain said flow pattern of all reactant gases within the reaction chamber to be substantially linear between the first distal end and the second distal end within said reaction chamber.

2. The method of claim 1, wherein each of said at least two outlet ports has an adjustable flow control device operatively attached thereto, and each of said flow control devices being configured to independently adjust said flow rate through said corresponding outlet port.

3. The method of claim 1, wherein said reaction chamber is configured to perform fabrication processes at a pressure less than atmospheric pressure within said reaction chamber.

4. The method of claim 1, wherein said reaction chamber is configured to perform fabrication processes at about atmospheric pressure within said reaction chamber.

5. The method of claim 1, wherein said at least two outlet ports are operatively connected to a vacuum for withdrawing said reactant gases from said reaction chamber using a suction force.

6. The method of claim 1, wherein said at least two outlet ports are operatively connected to a controller, said controller configured to selectively adjust said flow rate through said at least two outlet ports.

* * * * *